(12) United States Patent
Zhou et al.

(10) Patent No.: US 11,085,995 B2
(45) Date of Patent: Aug. 10, 2021

(54) NON-LINEAR SPRINGS TO UNIFY THE DYNAMIC MOTION OF INDIVIDUAL ELEMENTS IN A MICRO-MIRROR ARRAY

(71) Applicant: Beijing Voyager Technology Co., Ltd., Beijing (CN)

(72) Inventors: Qin Zhou, Mountain View, CA (US); Youmin Wang, Mountain View, CA (US)

(73) Assignee: Beijing Voyager Technology Co., Ltd., Beijing (CN)

( * ) Notice: Subject to any disclaimer, the term of this patent is extended or adjusted under 35 U.S.C. 154(b) by 71 days.

(21) Appl. No.: 16/213,995

(22) Filed: Dec. 7, 2018

(65) Prior Publication Data
US 2020/0182976 A1 Jun. 11, 2020

(51) Int. Cl.
| | | |
|---|---|---|
| *G02B 26/08* | (2006.01) | |
| *G02B 26/10* | (2006.01) | |
| *G02B 26/12* | (2006.01) | |
| *G01S 7/481* | (2006.01) | |
| *G02B 7/182* | (2021.01) | |
| *G01S 17/89* | (2020.01) | |
| *G01S 17/10* | (2020.01) | |
| *G01S 17/931* | (2020.01) | |

(52) U.S. Cl.
CPC .......... *G01S 7/4817* (2013.01); *G02B 7/1821* (2013.01); *G02B 26/085* (2013.01); *G02B 26/10* (2013.01); *G01S 17/10* (2013.01); *G01S 17/89* (2013.01); *G01S 17/931* (2020.01)

(58) Field of Classification Search
CPC ...... G01S 7/4817; G01S 17/931; G01S 17/89; G01S 17/10; G02B 26/085; G02B 26/10; G02B 7/1821; G02B 26/0841; G02B 26/105; B81B 3/00; G08G 1/00; G01C 19/661; G01C 19/5691
See application file for complete search history.

(56) References Cited

U.S. PATENT DOCUMENTS

| | | | |
|---|---|---|---|
| 6,526,194 B1 * | 2/2003 | Laor | G11B 7/1362 385/18 |
| 6,629,461 B2 | 10/2003 | Behin et al. | |
| 7,357,874 B2 | 4/2008 | Moffat et al. | |
| 9,036,231 B2 | 5/2015 | Zhou | |
| 10,048,374 B2 | 8/2018 | Hall et al. | |
| 2011/0062110 A1 | 3/2011 | Kumar et al. | |
| 2011/0303638 A1 | 12/2011 | Zhang et al. | |
| 2015/0217990 A1 * | 8/2015 | Carminati | B81B 3/0043 353/98 |
| 2017/0146792 A1 * | 5/2017 | Straub | G02B 26/085 |

FOREIGN PATENT DOCUMENTS

CN 109154661 1/2019

* cited by examiner

*Primary Examiner* — Mustak Choudhury
(74) *Attorney, Agent, or Firm* — Kilpatrick Townsend & Stockton LLP

(57) ABSTRACT

An array of micro mirrors is used to beam steer a laser for Light Detection and Ranging (LiDAR) applications. The array of micro mirrors are driven in a nonlinear motion to synchronize motion of the micro mirrors in the array.

20 Claims, 15 Drawing Sheets

NON-LINEAR SPRINGS TO UNIFY THE DYNAMIC MOTION OF INDIVIDUAL ELEMENTS IN A MICRO-MIRROR ARRAY

CROSS-REFERENCES TO RELATED APPLICATIONS

The following eight U.S. patent applications (which includes the present application) are being filed concurrently, and the entire disclosures of the other applications are incorporated by reference into this application for all purposes:

application Ser. No. 16/213,990, filed Dec. 7, 2018, entitled "MULTI-THRESHOLD LIDAR DETECTION";

application Ser. No. 16/213,992, filed Dec. 7, 2018, entitled "MIRROR ASSEMBLY FOR LIGHT STEERING";

application Ser. No. 16/214,010, filed Dec. 7, 2018, entitled "COUPLED AND SYNCHRONOUS MIRROR ELEMENTS IN A LIDAR-BASED MICRO-MIRROR ARRAY;

application Ser. No. 16/214,013, filed Dec. 7, 2018, entitled "COUPLED AND SYNCHRONOUS MIRROR ELEMENTS IN A LIDAR-BASED MICRO-MIRROR ARRAY";

application Ser. No. 16/213,995, filed Dec. 7, 2018, entitled "NON-LINEAR SPRINGS TO UNIFY THE DYNAMIC MOTION OF INDIVIDUAL ELEMENTS IN A MICRO-MIRROR ARRAY";

application Ser. No. 16/213,997, filed Dec. 7, 2018, entitled "NON-LINEAR SPRINGS TO UNIFY THE DYNAMIC MOTION OF INDIVIDUAL ELEMENTS IN A MICRO-MIRROR ARRAY";

application Ser. No. 16/213,999, filed Dec. 7, 2018, entitled "A LEVER SYSTEM FOR DRIVING MIRRORS OF A LIDAR TRANSMITTER"; and application Ser. No. 16/214,001, filed Dec. 7, 2018, entitled "SYSTEM AND METHODS FOR CONTROLLING MICRO-MIRROR ARRAY".

BACKGROUND

Light steering typically involves the projection of light in a pre-determined direction to facilitate, for example, the detection and ranging of an object, the illumination and scanning of an object, or the like. Light steering can be used in many different fields of applications including, for example, autonomous vehicles, medical diagnostic devices, etc.

Modern vehicles are often fitted with a suite of environment detection sensors that are designed to detect objects and landscape features around the vehicle in real-time that can be used as a foundation for many present and emerging technologies such as lane change assistance, collision avoidance, and autonomous driving capabilities. Some commonly used sensing systems include optical sensors (e.g., infra-red, cameras, etc.), radio detection and ranging (RADAR) for detecting presence, direction, distance, and speeds of other vehicles or objects, magnetometers (e.g., passive sensing of large ferrous objects, such as trucks, cars, or rail cars), and light detection and ranging (LiDAR).

LiDAR typically uses a pulsed light source and detection system to estimate distances to environmental features (e.g., vehicles, structures, etc.). In some systems, a laser or burst of light (pulse) is emitted and focused through a lens assembly and a reflection of the pulse off of an object is collected by a receiver. A time-of-flight (TOF) of the pulse can be measured from the time of emission to the time the reflection is received, which may manifest as a single data point. This process can be repeated very rapidly over any desired range (typically 360 degrees over a 2D plane for ground-based vehicles, and a 3D region for aircraft) to form a collection of points that are dynamically and continuously updated in real-time, forming a "point cloud." The point cloud data can be used to estimate, for example, a distance, dimension, and location of the object relative to the LiDAR system, often with very high fidelity (e.g., within 5 cm).

Despite the promise that LiDAR and other sensing systems bring to the continued development of fully autonomous transportation, there are challenges that limit its widespread adoption. LiDAR systems are often expensive, large, and bulky. In some cases, multiple emitters may be needed to accurate track a scene, particularly for systems that require accuracy over a large range and field-of-view (FOV). While significant strides have been made to push autonomous vehicle technology to greater commercial adoption, more improvements are needed.

BRIEF SUMMARY

Steering mirrors in Light Detection and Ranging (LiDAR) systems are commonly bulky. The more mass a mirror has, the more slowly it moves. For fast scanning, it is challenging to move a bulky mirror quickly. Yet reducing a size of the mirror can reduce light intensity of received laser pulses. In some embodiments, an array of microelectromechanical system (MEMS) mirrors is used in LiDAR scanning system to increase scanning speed while not losing as much light intensity (e.g., one laser beam is reflected by a plurality of MEMS mirrors synchronized to act as one large reflective surface). Yet synchronizing movement of MEMS mirrors can be challenging. In some embodiments, mirrors are driven nonlinearly so that it is easier to match amplitude and phase of mirrors moving in a synchronized array.

In certain embodiments, a device for beam steering in a Light Detection and Ranging (LiDAR) system of an autonomous vehicle comprises: a mirror; a spring mechanically coupled with the mirror; a combdrive actuator configured to move the mirror, the spring, or both the mirror and the spring; and/or a limiter configured to limit a range of motion of the mirror, the spring, or both the mirror and the spring. In some embodiments, the mirror is formed as part of a microelectromechanical system; the limiter comprises a hard stop configured to contact the mirror to prevent the mirror from continued rotation about an axis; the hard stop is glass; the mirror comprises a support and a reflective surface; the mirror is rectangular; the mirror is mechanically coupled with the spring by a shaft; the shaft has a rectangular cross section; the limiter comprises a contact to limit a range of motion of the shaft; the contact comprises a spring; the spring of the limiter is configured to have a stiffness based on a mass of the mirror; the combdrive actuator comprises a plurality of stator fingers and a plurality of rotor fingers; the limiter comprises a first set a magnets and a second set of magnets; the first set of magnets are positioned on a substrate; the second set of magnets are positioned on the mirror; the first set of magnets are oriented to repulse the second set of magnets; the device is configured as a scanning mirror in a LiDAR system; the device further comprises a plurality of mirrors, wherein the mirror is part of the plurality of mirrors, and the plurality of mirrors are synchronized to move together in time so that angular rotation of the plurality of mirrors are the same; the device further comprises a plurality of drivers configured to move the plurality of mirrors, wherein the plurality of drivers are configured to dive mirrors of the plurality of mirrors at the same frequency.

In certain configurations, a method of using a mirror array comprises: rotating a plurality of mirrors, wherein: rotating comprises using a plurality of drivers operating at the same frequency, and rotating the plurality of mirrors is performed so that motion of the plurality of mirrors is synchronized; shining a laser beam at the plurality of mirrors; reflecting the laser beam using the plurality of mirrors, so that the mirrors act as a single mirror to reflect the laser beam; and/or partially blocking movement of each mirror of the plurality of mirrors so that movement of each mirror is nonlinear. In some embodiments blocking movement of each mirror of the plurality of mirrors blocks rotation of a shaft used to move the mirror and/or blocks rotation of the plurality of mirrors by physical contact with the mirror; and/or blocking movement of each mirror of the plurality of mirrors is performed using magnetic repulsion.

In certain configurations, a method of manufacturing a device for use in a Light Detection and Ranging (LiDAR) system comprises etching to define a mirror support; etching to define a spring; etching a shaft that mechanically couples the mirror support with the spring; etching rotors and stators of a driver, wherein the driver is configured to move the shaft; etching a contact configured to limit a rotation of the shaft; and/or coating at least a portion of the mirror support to create a reflective surface on the mirror support.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

The detailed description is set forth with reference to the accompanying figures.

Figure 1:
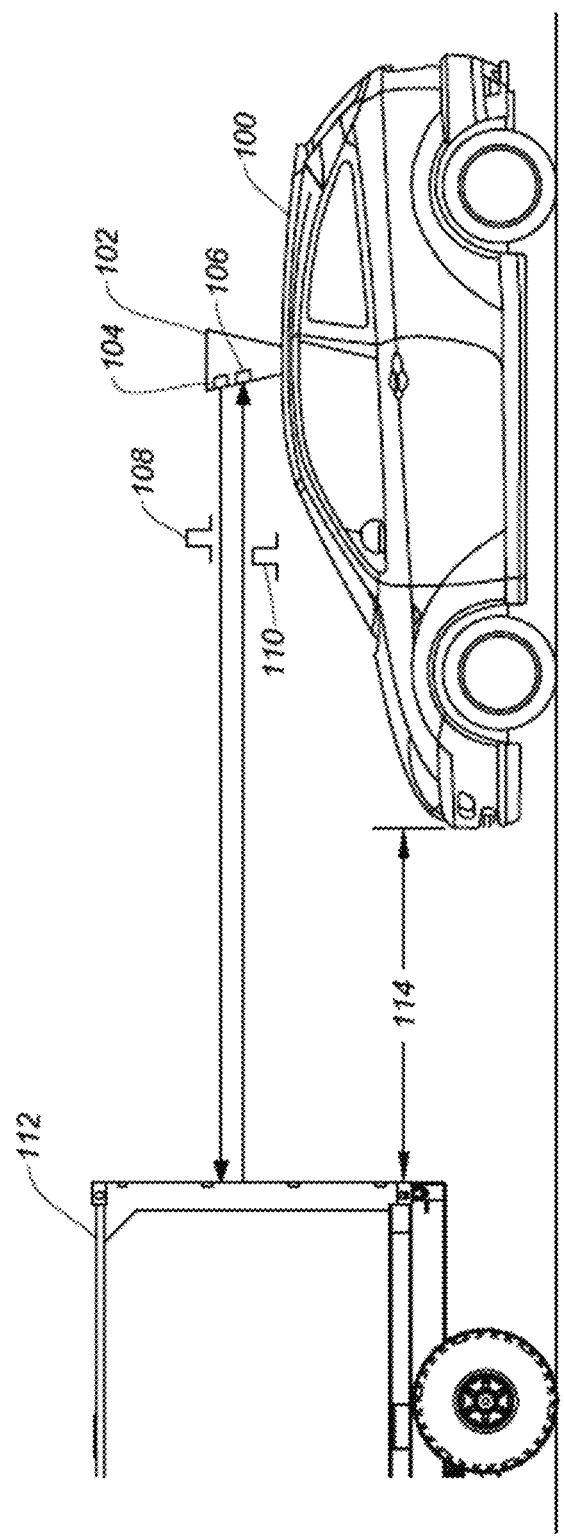
FIG. 1 shows an autonomous driving vehicle utilizing aspects of certain embodiments disclosed.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Aspects of the present disclosure relate generally to mirrors used for beam steering, and without limitation, to beam steering in a Light Detection and Ranging (LiDAR) system (e.g., for use in a system with an autonomous vehicle). Other examples of beam steering include: the head light of a manually-driven vehicle can include the light steering transmitter, which can be controlled to focus light towards a particular direction to improve visibility for the driver; and optical diagnostic equipment, such as an endoscope, can include a light steering transmitter to steer light in different directions onto an object in a sequential scanning process to obtain an image of the object for diagnosis.

A light steering transmitter may include a movable mirror assembly to facilitate configurable and precise control of a light projection. A mirror can be moved (e.g., rotated) by actuators to reflect (and steer) light from a light source towards a pre-determined angle. The mirror can be rotated to provide a first range of angles of projection along a vertical axis and to provide a second range of angles of projection along a horizontal axis. The first range and the second range of angles of projection can define a two-dimensional field of view (FOV) in which an object can be detected/scanned.

Light steering can be implemented by way of a mirror assembly included in the light steering transmitter. A mirror in the mirror assembly can be moved by actuators to steer light from a light source towards a pre-configured direction. For improved integration, the mirror assembly, actuators, and the control circuitries that configure the actuators to set the angles of projection can be integrated on a semiconductor substrate, with the mirror assembly and actuators can be formed as microelectromechanical systems (MEMS) on the semiconductor substrate.

In some examples, a mirror assembly may include a single mirror. The single mirror can be coupled with two pairs of actuators and rotatable on two non-parallel axes (e.g., orthogonal axes). A first pair, or set, of actuators can rotate the mirror around a first axis to steer the light along a first dimension, whereas a second pair, or set, of actuators can rotate the mirror around a second axis to steer the light along a second dimension. Different combinations of angle of rotations around the first axis and the second axis can provide a two-dimensional FOV.

The mirror assembly can dominate various performance metrics of the light steering transmitter including, for example, precision, actuation power, FOV, dispersion angle, reliability, etc. It is desirable to provide a mirror assembly that can improve these performance metrics.

A size of a mirror, with respect to a beam of light incident on the mirror (e.g., a width of the mirror compared to a width of a laser beam), may affect the dispersion of the steered light as the beam of light propagates, which in turn can affect ranging and imaging of object within the FOV. Accordingly, it may be preferable in some configurations to have a larger reflective surface.

Conversely, the larger the mirror, the more mass the mirror likely has and the more slowly it moves. For fast scanning, it is challenging to move a bulky mirror quickly. Yet reducing a size of the mirror can reduce light intensity of received laser pulses (e.g., if the mirror has a smaller width than a beam of light used for LiDAR). Further, subjecting actuators to larger actuation forces, especially for MEMS actuators, can shorten the lifespan and reduce the reliability of the actuators. Moreover, the reliability of the MEMS actuators may be further degraded when a light steering transmitter relies solely on the single mirror to steer the light, which can become a single point of failure.

In some embodiments, an array of microelectromechanical system (MEMS) mirrors is used in LiDAR scanning system to increase scanning speed and to increase reflective surface area (e.g., one laser beam is reflected by a plurality of MEMS mirrors synchronized to act as one large reflective area). Yet synchronizing movement of MEMS mirrors can be challenging. In some embodiments, mirrors are driven nonlinearly so that it is easier to match amplitude and phase of mirrors in an array. Driving mirrors nonlinearly can be accomplished several different ways. For example, a hard stop can be used to stop a mirror from rotating. Examples of a hard stop include a substrate that sides of the mirror contact and a blocking element that stops rotation of a shaft. Another way to drive mirror nonlinearly can be accomplished through electromagnetic repulsion.

In the following description, various examples of a mirror assembly and a light steering transmitter system will be described. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

FIG. 1 illustrates an embodiment of an autonomous vehicle 100 in which the disclosed techniques can be implemented. The autonomous vehicle 100 includes a LiDAR module 102. LiDAR module 102 allows the autonomous vehicle 100 to perform object detection and ranging in a surrounding environment. Based on results of object detection and ranging, the autonomous vehicle 100 can maneuver to avoid a collision with objects. The LiDAR module 102 can include a transmitter 104 and a receiver 106 for light steering. The transmitter 104 can project one or more light pulses 108 at various directions at different times in a scanning pattern, while receiver 106 can monitor for a light pulse 110 which is generated by the reflection of light pulse 108 by an object. LiDAR module 102 can detect the object based on the reception of light pulse 110, and can perform a ranging determination (e.g., a distance of the object) based on a time difference between light pulses 108 and 110 and/or based on phase difference between light pulses 108 and 110. For example, as shown in FIG. 1, the LiDAR module 102 can transmit light pulse 108 at a direction directly in front of autonomous vehicle 100 at time T1 and receive light pulse 110 reflected by an object 112 (e.g., another vehicle) at time T2. Based on the reception of light pulse 110, LiDAR module 102 can determine that object 112 is directly in front of autonomous vehicle 100. Moreover, based on the time difference between T1 and T2, LiDAR module 102 can also determine a distance 114 between autonomous vehicle 100 and object 112. The autonomous vehicle 100 can adjust its speed (e.g., slowing or stopping) to avoid collision with object 112 based on the detection and ranging of object 112 by LiDAR module 102.

Figure 2:
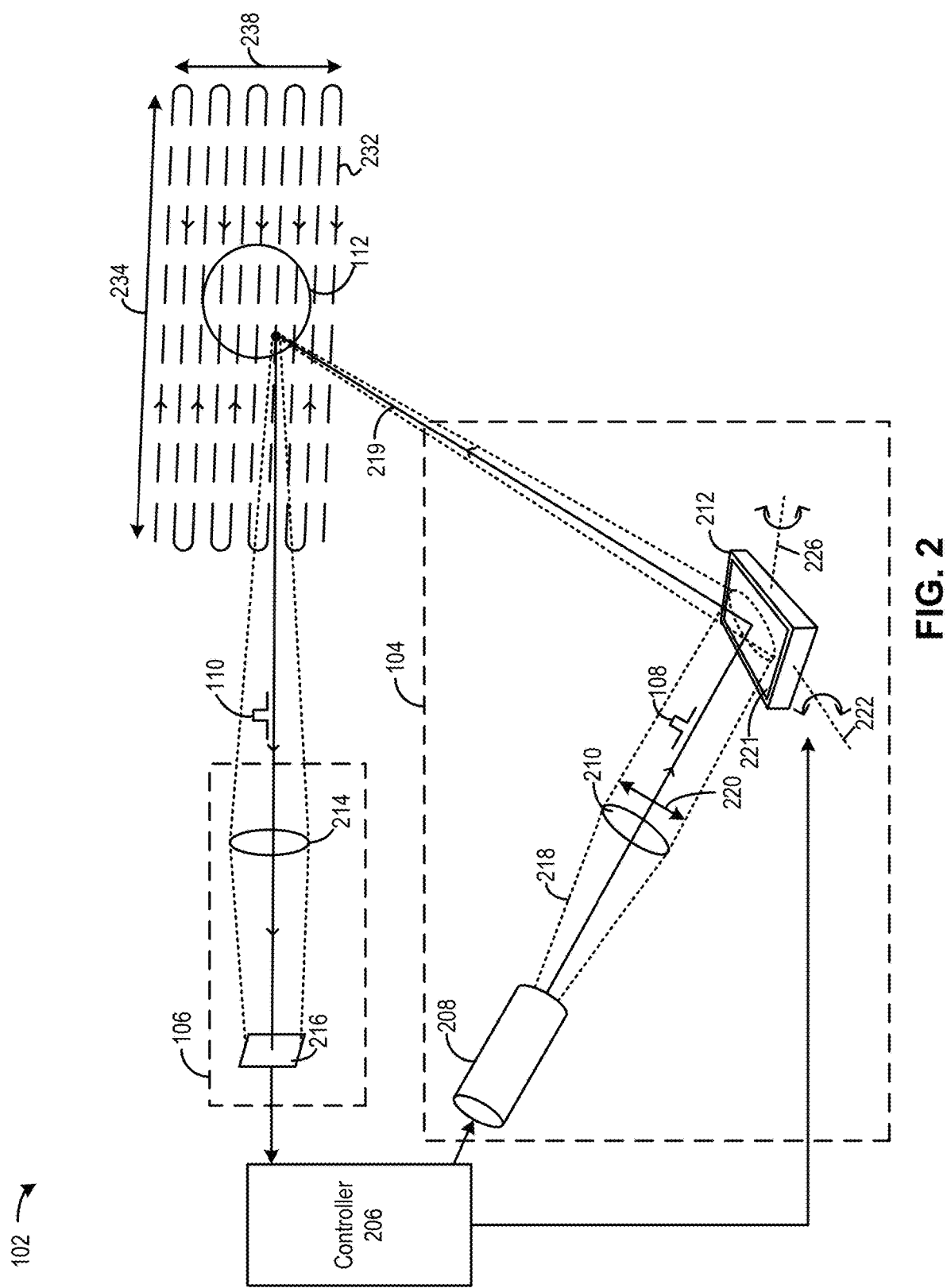
FIG. 2 illustrates an example of a light steering transmitter, according to certain embodiments.

FIG. 2 illustrates an example of internal components of a LiDAR module 102. LiDAR module 102 includes the transmitter 104, the receiver 106, and a controller 206, which controls the operations of the transmitter 104 and the receiver 106. Transmitter 104 includes a light source 208, a lens 210, and a mirror assembly 212. The light source 208 is configured to generate light pulses 108. In some embodiments, the light source 208 is a laser diode. The lens 210 is a collimator lens configured to collimate light emitted from the light source 208. The receiver 106 comprises a lens 214 and a detector 216 (e.g., a photodetector). The lens 214 is configured to focus light from light pulses 110 onto the detector 216.

The controller 206 can control the light source 208 to transmit light pulse 108, which is part of an optical beam 218. The optical beam 218 can diverge upon leaving the light source 208. The optical beam 218 is collimated by passing through lens 210. Lens 210 has an aperture width (e.g., diameter of lens 210), which can set a beam width 220 of collimated light incident on the mirror assembly 212.

The optical beam 218 is reflected by the mirror assembly 212 and steered by the mirror assembly 212 along a projection path 219 towards the object 112. The mirror assembly 212 includes one or more mirrors 221, which is rotatable. FIG. 2 illustrates the mirror assembly 212 having one mirror 221, but as to be described below, in some embodiments the mirror assembly 212 includes a plurality of mirrors. To reduce loss of light, the mirror 221 can have a length (and/or width) that matches the beam width 220. Such an arrangement can enable the mirror assembly 212 to reflect and project a larger portion of light and to mitigate dispersion.

The mirror assembly 212 further includes one or more actuators to rotate the mirror 221. The actuators can rotate mirror 221 about a first axis 222, and about a second axis 226. Rotation about the first axis 222 can change a first angle of the projection path 219 and rotation about the second axis 226 can change a second angle of the projection path 219. The controller 206 can control the actuators to produce different combinations of angles of rotation around the first axis 222 and the second axis 226 such that the movement of the projection path 219 can follow a scanning pattern 232. The scanning pattern has a first range 234 (e.g., horizontal) and a second range 238 (e.g., vertical). The first range 234 and the second range 238 define a field of view (FOV) of the transmitter 104. Light from the optical beam 218 reflects from an object within the FOV, such as object 112, to form light pulse 110, which is a reflected pulse. The light pulse 110 is detected by the receiver 106.

The mirror assembly 212 has been shown as part of the transmitter 104. The mirror assembly 212, or a second mirror assembly 212, can be used as part of the receiver 106. The mirror assembly 212 (e.g., as part of a micro-mirror array) can be placed before the lens 214. Using the mirror assembly 212 as part of the receiver 106 can reduce interference. Without using a mirror assembly 212 in the receiver 106, light from many directions is collected by the detector 216. Accordingly, light sources, such as sunlight and lasers emitted by other cars, can also be detected by the detector 216, which could reduce performance of the receiver 106 detecting pulse 110. By placing a micro-mirror array before lens 214, light from only a desired direction is collected, which can reduce noise from other light sources. In some embodiments, one mirror assembly 212 (e.g., alone or as part of a mirror array) is used for both the transmitter 104 and the receiver 106 (e.g., in a co-axial configuration, with a beam splitter placed between lens 210 and mirror assembly 212; pulse 110 is returned to the mirror assembly 212, reflected by the mirror assembly 212 towards the beam splitter; reflected by the beam splitter towards the lens 214, and focused by the lens 214 to the detector 216).

Figure 3:
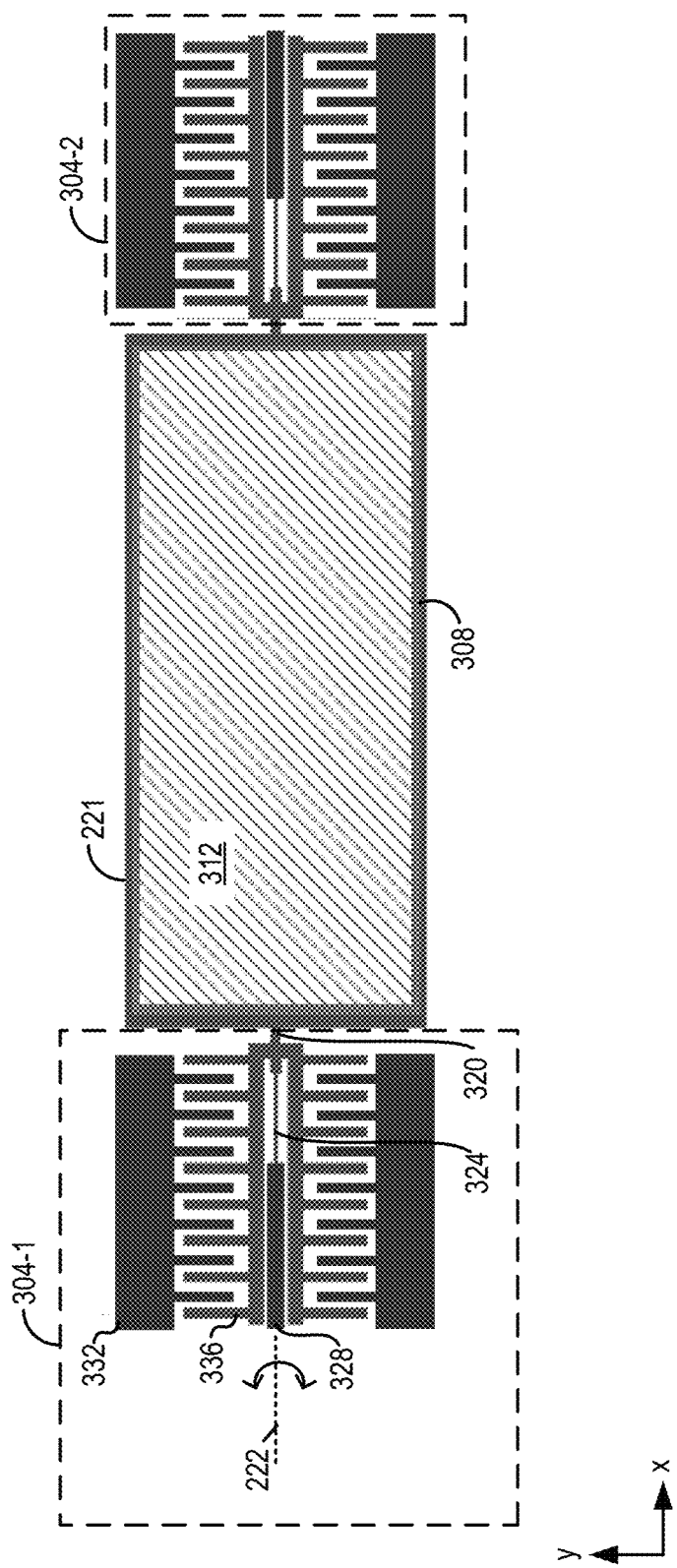
FIG. 3 depicts part of an embodiment of a mirror assembly.

FIG. 3 depicts part of an embodiment of a mirror assembly 212. The mirror assembly 212 comprises a mirror 221 and an actuator 304. The mirror comprises a mirror substrate 308 and a reflective surface 312. The mirror substrate 308 is a substrate for the reflective surface 312 to be applied to, e.g., sputtering alternating dialectic layers of materials on the substrate to form a Bragg mirror on the substrate as the reflective surface 312. In some embodiments, the substrate is part of a silicon-on-insulator (SOI) wafer, and the reflective surface 312 is applied on top of a device layer of the SOI wafer. The mirror substrate 308, the shaft 320, the spring 324, the post 328, the stator 332, and/or the rotor 336 can be made using photolithography, e.g., the mirror substrate 308, the shaft 320, the spring 324, the post 328, the stator 332, and/or the rotor 336 are etched concurrently from a device layer of an SOI wafer. In some embodiments, electrical elements for the combdrive actuator are formed in the device layer of the SOI wafer.

The actuator 304 comprises a shaft 320, a spring 324, a post 328, and a combdrive actuator. The combdrive actuator comprises a stator 332 and a rotor 336. In some embodiments, the combdrive actuator (e.g., a vertical comb drive) has a plurality of stator fingers and plurality of rotor fingers. The spring 324 is mechanically coupled with the mirror 221. For example, the spring 324 is coupled to the rotor 336; the rotor 336 is coupled to the shaft 320, and the shaft 320 is coupled to the mirror substrate 308 of the mirror 221. The rotor 336 rotates back and forth around the first axis 222, e.g., +/−10, 15, 20, 25, or 30 degrees. As the rotor 336 moves, the spring 324 is twisted and the mirror 221 is rotated. The actuator 304 can be configured to work in pairs to move the mirror 221 about the first axis 222. In the embodiment shown, a first actuator 304-1 and a second actuator 304-2 work together as a pair to move the mirror 221 about the first axis 222.

The spring 324 is coupled to the rotor 336 and the post 328. The post 328 does not rotate. An electrical signal is applied to the combdrive actuator to cause magnetic repulsion and/or attraction between the stator 332 and the rotor 336. As the rotor 336 rotates, the spring 324 is twisted, storing mechanical energy and applying a torque to the rotor 336 and/or to the shaft 320. As the rotor 336 rotates, the mirror 221 rotates because the mirror 221 is coupled to the rotor 336 by the shaft 320. An angle of the reflective surface 312 with respect to the light source 208 changes as the mirror 221 rotates. The spring 324 and the combdrive actuator move the mirror 221 to oscillate at a given frequency, thus steering the projection path 219 of the optical beam 218 back and forth (e.g., horizontally) within the first range 234. A different actuator and/or combdrive actuator system moves the mirror 221 about the second axis 226.

In some embodiments, the substrate is part of a silicon-on-insulator (SOI) wafer, and the reflective surface 312 is applied on top of a device layer of the SOI wafer. The reflective surface 312 is rectangular to provide more reflective surface area of an array of mirrors and/or to more efficiently use space on a chip. In some embodiments, the reflective surface has a width (e.g., along the x dimension) equal to or less than 20, 15, 10, or 5 millimeters and/or equal to or greater than 1, 3, 5, or 8 millimeters. The mirror substrate 308, the shaft 320, the spring 324, the post 328, the stator 332, and/or the rotor 336 can be made using photolithography, e.g., the mirror substrate 308, the shaft 320, the spring 324, the post 328, the stator 332, and/or the rotor 336 are etched concurrently from a device layer of an SOI wafer. In some embodiments, electrical elements for the combdrive actuator are formed in the device layer of the SOI wafer.

Figure 4:
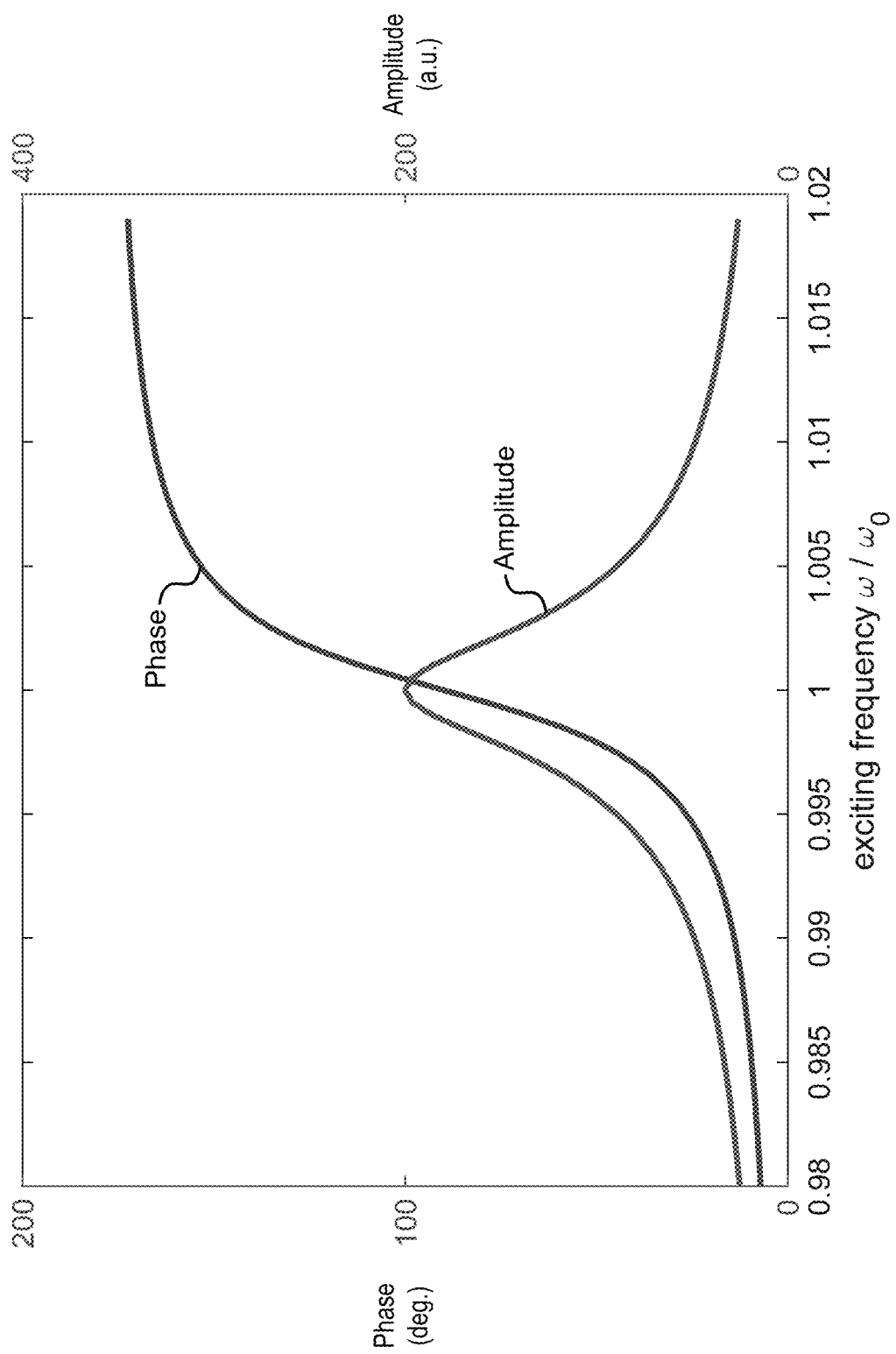
FIG. 4 depicts a graph of phase and amplitude in relation to an excitation frequency for an embodiment of an oscillating mirror.

FIG. 4 depicts a graph of phase and amplitude in relation to an excitation frequency for an embodiment of an oscillating mirror. The combdrive actuator drives the mirror 321 at a drive frequency $\omega$. The drive frequency $\omega$ is an angular frequency. The mirror has a resonant frequency $\omega_0$. The resonant frequency $\omega_0$ is a function of a spring constant of the spring 324 and a mass of the mirror 321. Exciting frequency is a relationship of the drive frequency $\omega$ divided by the resonant frequency $\omega_0$.

Phase is the difference between torque on the shaft 320 by the combdrive actuator and rotation of the mirror 221. FIG. 4 shows that maximum amplitude of oscillation of the mirror 221 is when the drive frequency $\omega$ of the combdrive actuator is equal to the resonant frequency $\omega_0$. The phase is 90 degrees when the when the drive frequency $\omega$ of the combdrive actuator is equal to the resonant frequency $\omega_0$.

A small change between the drive frequency $\omega$ and the resonant frequency $\omega_0$ causes a large change in the amplitude and the phase. In a mirror array, mass of mirrors 221 can vary to cause up to 0.4, 0.8, 1.0% or more variance in resonant frequency $\omega_0$ between mirrors 221. For example, variations in deposition thicknesses of layers forming reflective surfaces 312 across a wafer can cause a one mirror to be heavier than another mirror. For example, a first mirror having a resonant frequency $\omega_0$ equal to the drive frequency $\omega$ (exciting frequency equal to one) has a maximum amplitude and has a mirror rotation out of phase with the drive frequency $\omega$ by about 100 degrees. In comparison, a second mirror having a resonant frequency $\omega_0$ so that the exciting frequency is 0.995 has an amplitude of movement about half of that of the first mirror's amplitude, and the mirror rotation is out of phase with the drive frequency $\omega$ by about 20 degrees. Thus the first mirror and the second mirror would not be rotating in phase with each other if the same drive frequency $\omega$ was applied to the both the first mirror and the second mirror.

One way to synchronously drive mirrors 221 in an array is to vary drive frequencies w for each mirror 221. Such a system, with feedback and control loops, could become very complex, especially for a large array of mirrors 221 (e.g., an array of 100×100 mirrors having 10,000 control systems).

Another option is to have mechanical control (e.g., limiting movement of a mirror 221) instead of, or in addition to, electrical control. Examples of limiting movement of a mirror 221 including using a hard stop, limiting rotation of the shaft, using electrostatic force, using magnetic force, and using a soft stop (e.g., using a spring that engages for mirror rotations past a certain angle). In each example, a limiter is used. Several examples will be described in more detail below. By using a limiter to drive the mirrors nonlinearly, immediate correction is provided and the design can be simplified by not having so many electronic feedback loops. Nonlinear movement of the mirrors allows one drive frequency to drive a plurality of mirrors in sync with each other, even though the plurality of mirrors have variations in resonant frequencies.

Figure 5:
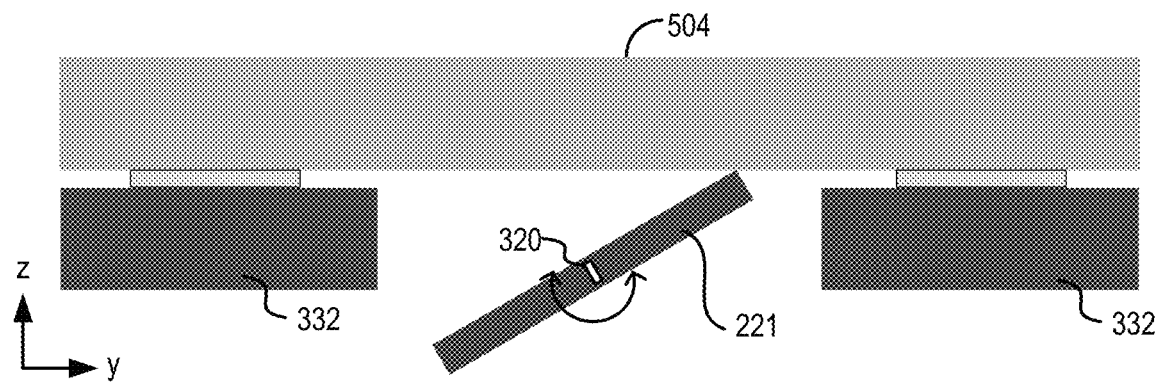
FIG. 5 depicts a simplified diagram of an embodiment of a hard stop used to limit motion of a mirror.

FIG. 5 depicts a simplified diagram of an embodiment of a hard stop used to limit motion of the mirror 221. In FIG. 5, a plate 504 (e.g., glass) is bonded to the stator 332. The plate 504 is a limiter because the plate 504 blocks the mirror 221 from rotating past a certain angle. Because the plate 504 blocks motion of the mirror 221, the mirror 221 moves nonlinearly in response to a drive voltage of the combdrive actuator.

Figure 6:
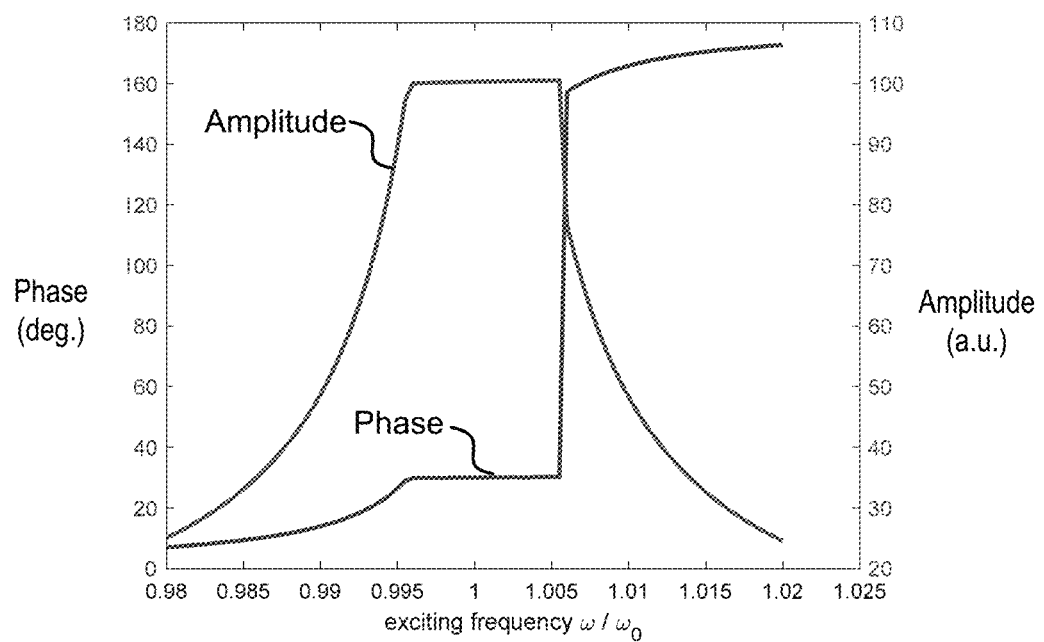
FIG. 6 depicts a graph of phase and amplitude in relation to an excitation frequency for an embodiment of an oscillating mirror having a hard stop.

FIG. 6 depicts a graph of phase and amplitude in relation to an excitation frequency for an embodiment of an oscillating mirror having a hard stop (e.g., the plate 504 in FIG. 5). The hard stop not only limits the amplitude (see constant amplitude for exciting frequency between 0.995 and 1.006), the hard stop also provides a region of constant phase (see phase for exciting frequency between 0.995 and 1.006). Thus a plurality of mirrors 221 having varying resonant frequencies $\omega_0$ can be driven synchronously by combdrive actuators configured to have the same drive frequency $\omega$. The phase in FIG. 6 is between 20 and 40 degrees, not 90 degrees like in FIG. 4.

Figure 7:
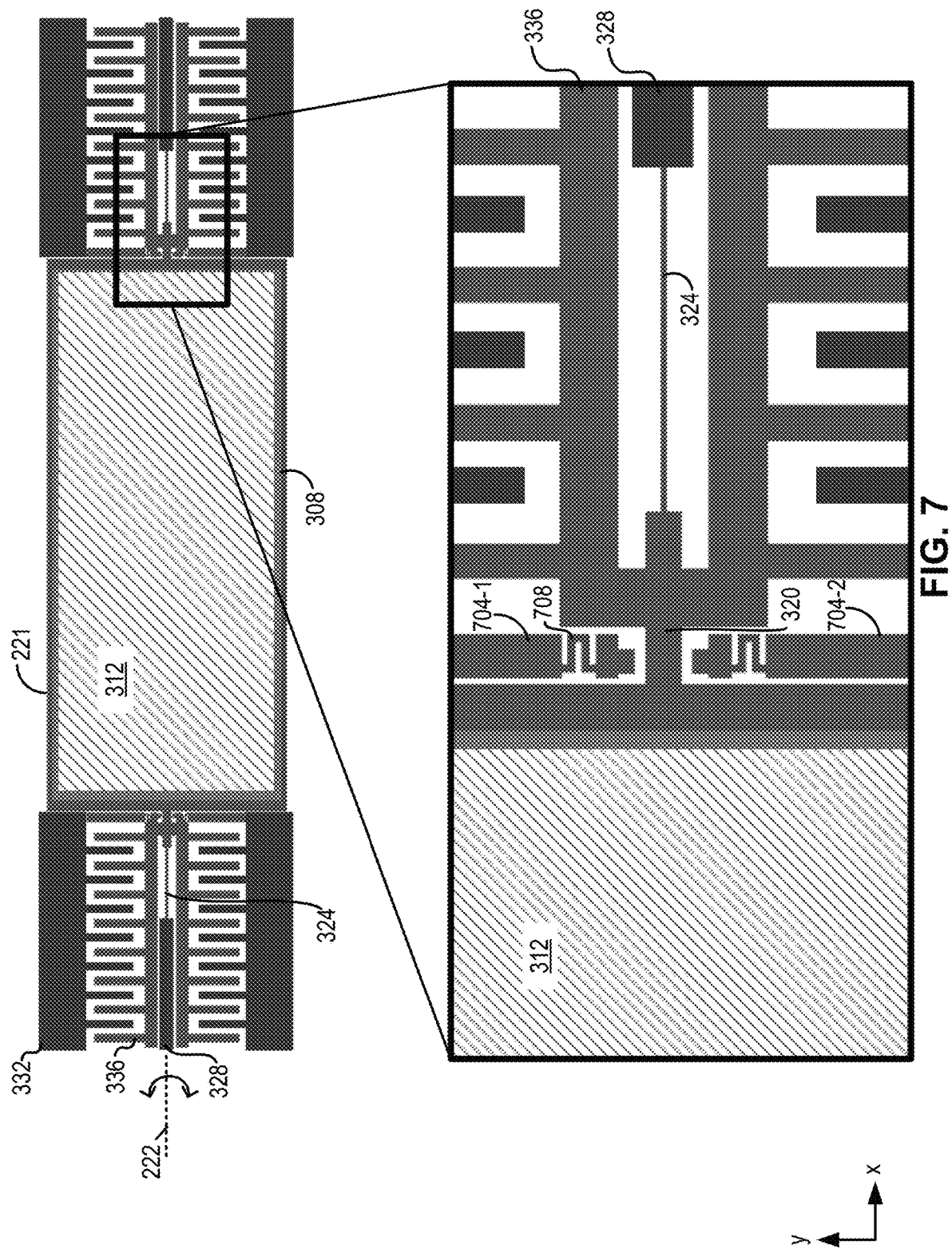
FIG. 7 depicts a top view of an embodiment of a blocking element used to limit a rotation of a shaft coupled with a mirror.

FIG. 7 depicts a top view of an embodiment of a blocking element 704 used to limit a rotation of the shaft 320. The blocking element 704 can be referred to as a limiter. A first blocking element 704-1 and a second blocking element 704-2 are on two sides of the shaft 320. As the shaft 320 rotates the shaft 320 makes contact with the first blocking element 704-1, the second blocking element 704-2, or both the first blocking element 704-1 and the second blocking element 704-2. A spring 708 is formed in the blocking element 704 to reduce impact of the contact between the shaft 320 and the blocking element 704.

Figure 8:
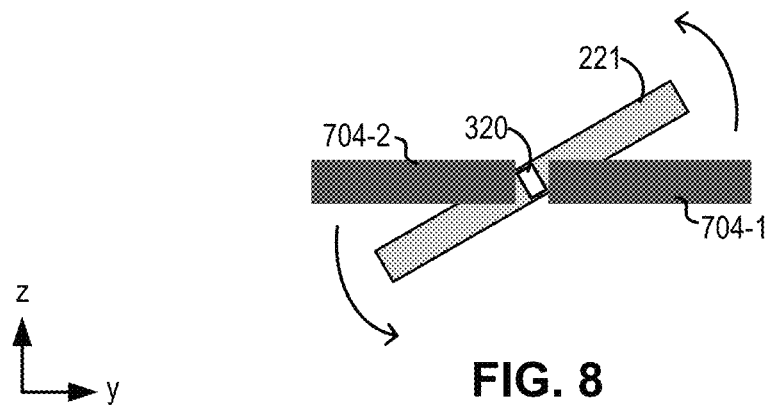
FIG. 8 depicts a simplified side view of an embodiment of a shaft contacting blocking elements.

FIG. 8 depicts a simplified side view of an embodiment of the shaft 320 contacting blocking elements 704. As the mirror 221 rotates, e.g., counter clockwise while looking at the shaft 320, the shaft comes into contact with one or more blocking elements 704. The blocking element 704 prevents the shaft 320 from being able to continue to rotate, and thus the mirror 221 is also prevented from continuing to rotate.

Figure 9:
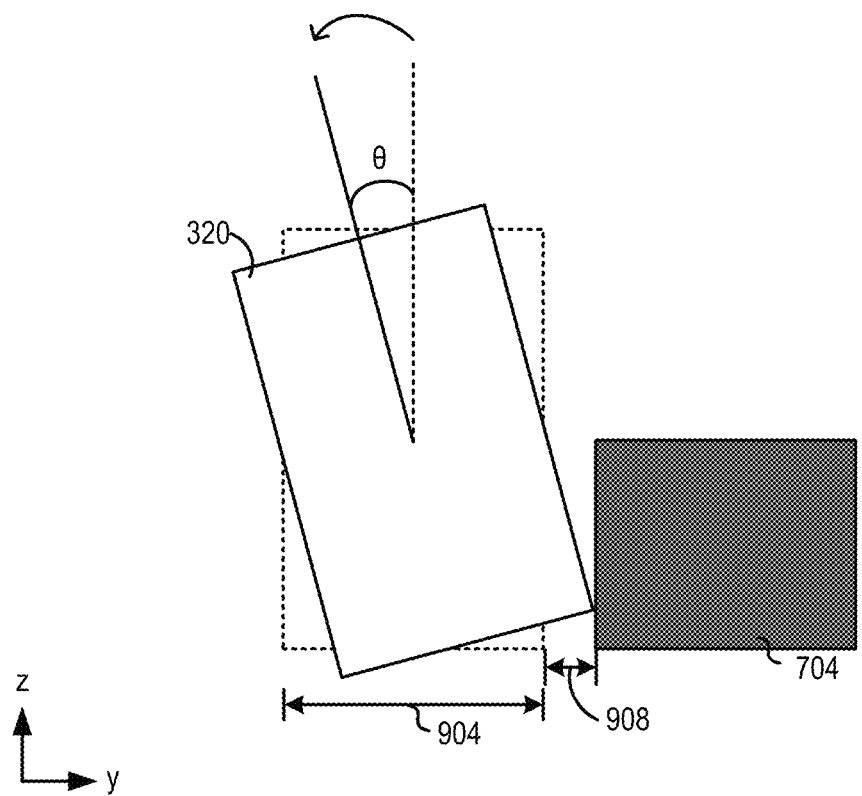
FIG. 9 is a further simplified side view of the embodiment of the shaft contacting a blocking element.

FIG. 9 is a further simplified side view of the embodiment of the shaft 320 contacting the blocking element 704. The shaft 320 is shown in a rotated position; a neutral position of the shaft 320 is illustrated by a box with a dashed line. The shaft can rotate plus and minus $\theta$ degrees. In some embodiments, $\theta$ is equal to or greater than 1, 5, or 10 degrees and equal to or less than 20, 30, 40, or 45 degrees (e.g., $\theta$ equals 15, 20, or 30 degrees). In some embodiments, $\theta$ is equal to or less than 15, 20, or 30 degrees for faster scanning speed and/or more robust mechanical stopping of the shaft 320 by the blocking element 704.

The shaft 320 has a width 904 and is separated from the blocking element 704 by a gap 908, wherein the gap 908 is measured while the shaft 320 is in a neutral position (e.g., a position that the shaft 320 is in when first formed by etching). In some embodiments the shaft 320 is rectangular. In some embodiments, the width 904 of the shaft 320 is equal to or greater than 20, 30, or 40 microns and/or equal to or less than 70, 90, or 100 microns (e.g., 45, 50, 55, or 60 microns). In some embodiments, the gap 908 is equal to or greater than 1, 5, or 10 microns wide and/or equal to or less than 10, 20, or 30 microns wide (e.g., 5, 10, 15, or 20 microns wide).

Figure 10:
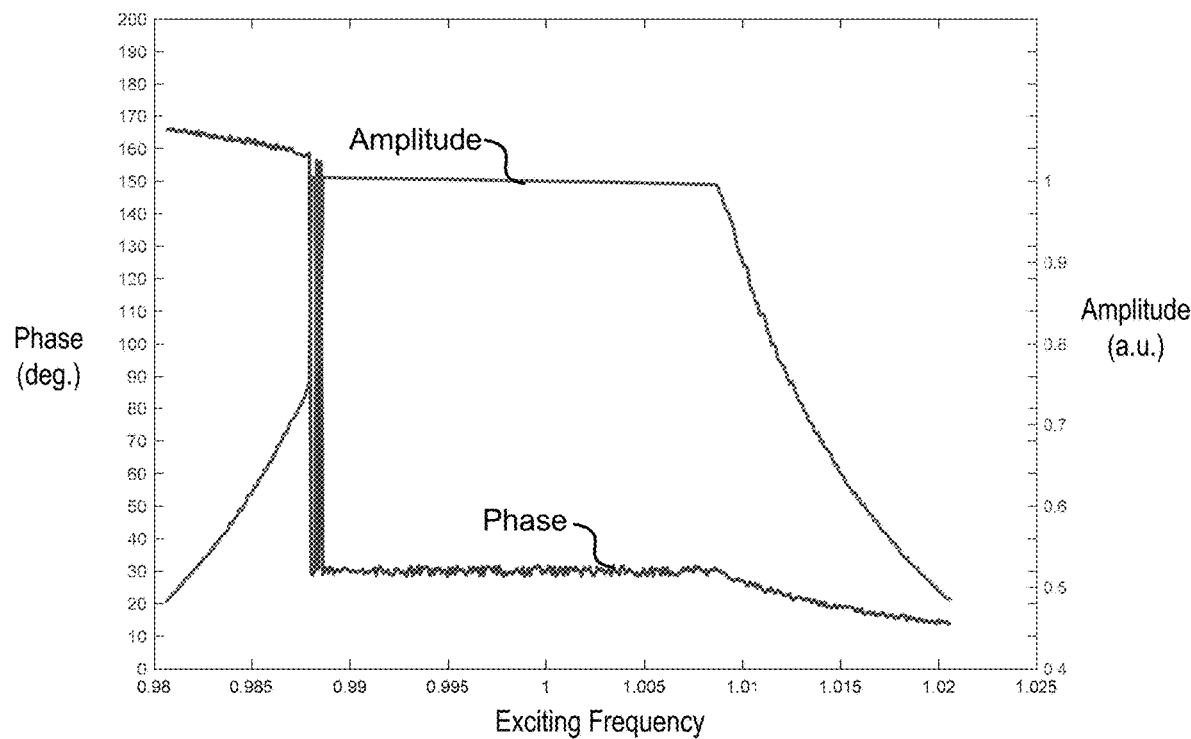
FIG. 10 depicts a graph of phase and amplitude in relation to an excitation frequency for an embodiment of an oscillating mirror limited by rotation of a shaft.

FIG. 10 depicts a graph of phase and amplitude in relation to an excitation frequency for an embodiment of an oscillating mirror limited by rotation of the shaft 320 (e.g, by using the blocking element 704). Blocking rotation of the shaft 320 not only limits the amplitude (see constant amplitude for exciting frequency between 0.989 and 1.009), it also provides a region of constant phase (see phase for exciting frequency between 0.989 and 1.009). Thus a plurality of mirrors 221 having varying resonant frequencies $\omega_0$ can be driven synchronously by combdrive actuators configured to have the same drive frequency $\omega$. The phase in FIG. 10 is between 20 and 40 degrees, not 90 degrees like in FIG. 4.

Figure 11:
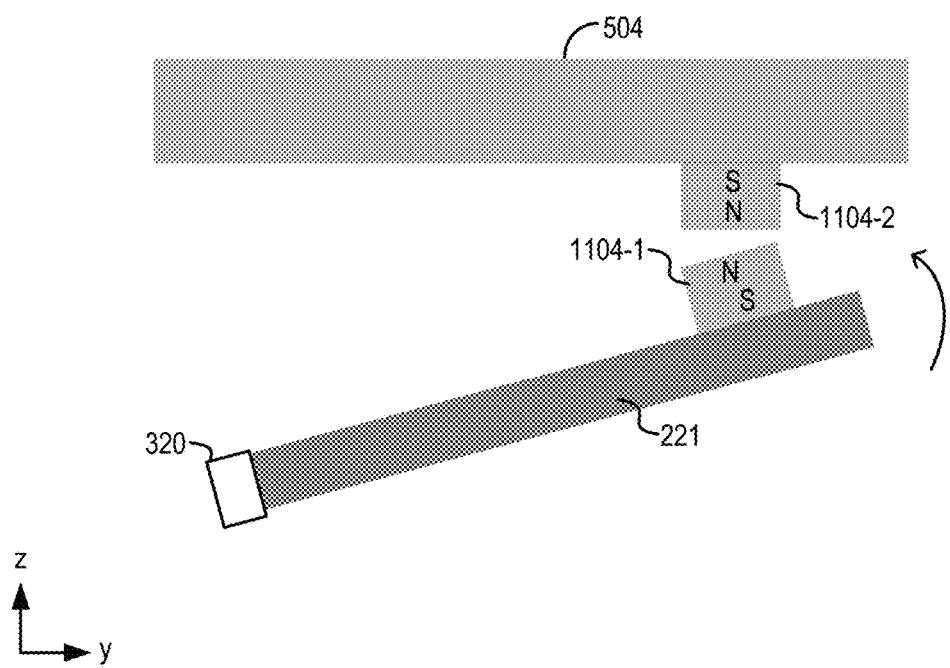
FIG. 11 depicts a simplified diagram of an embodiment using magnetic repulsion to limit rotation of a mirror.

FIG. 11 depicts a simplified diagram of an embodiment using magnetic repulsion to limit rotation of the mirror 221. Magnets 1104 are used for magnetic repulsion. The magnets 1104 can be referred to as a limiter. A first magnet 1104-1 is secured to the mirror 221 and a second magnet 1104-2 is secured to plate 504. Polarity of the first magnet 1104-1 is opposite of the second magnet 1104-2, so that the second magnet 1104-2 repels the first magnet 1104-1 as the first magnet 1104-1 is brought closer to the second magnet 1104-2 as the mirror 221 rotates. Using magnetic repulsion can help limit impact to on the plate 504 compared to using a hard stop in FIG. 5.

Figure 12:
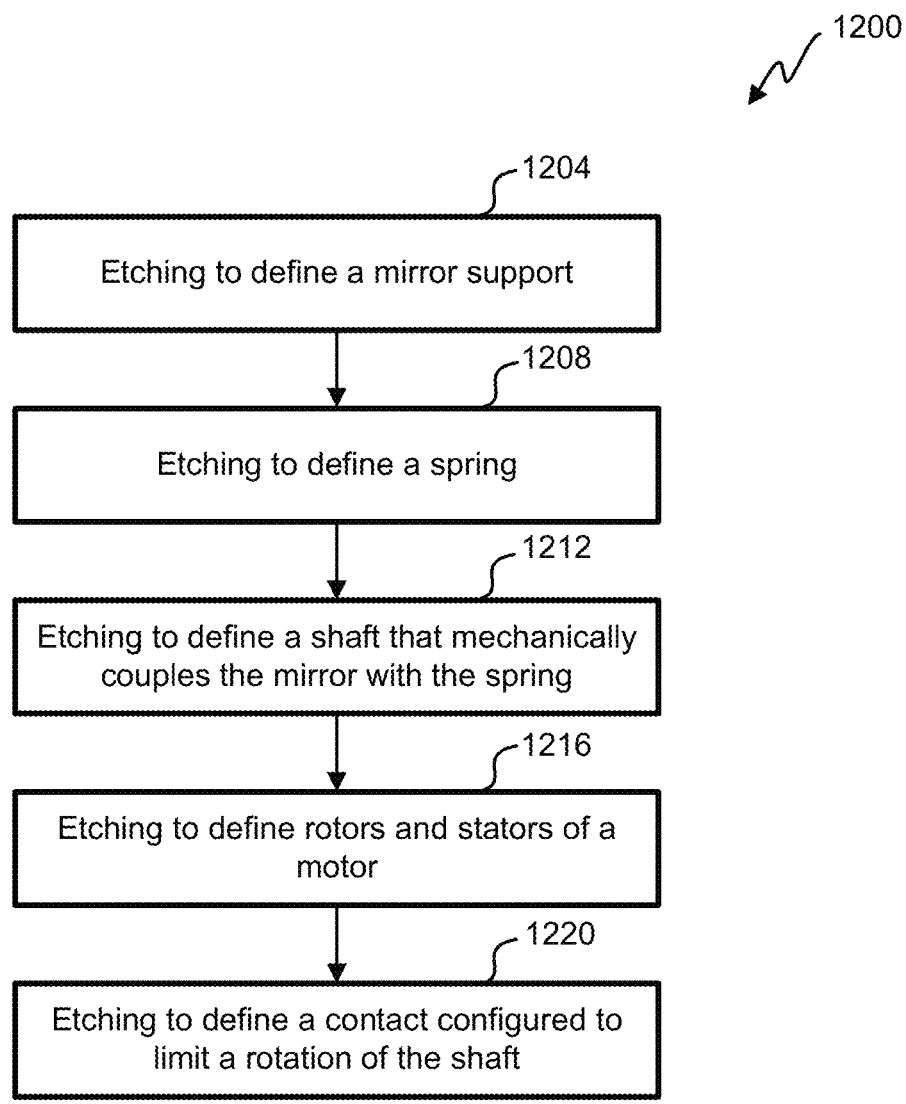
FIG. 12 illustrates a flowchart of an embodiment of a method of manufacturing a device for use in a LiDAR system.

FIG. 12 illustrates a flowchart of an embodiment of a process 1200 of manufacturing a device for use in a LiDAR system. Process 1200 begins in step 1204 with etching a wafer to define a mirror support (e.g., mirror substrate 308). The wafer can be a silicon-on-insulator (SOI) wafer, and etching is etching a device layer of the SOI wafer. In step 1208, the wafer is etched (e.g., the device layer is etched) to define a spring (e.g., spring 324). The wafer is etched to define a shaft, wherein the shaft mechanically couples the mirror support with the spring, step 1212. In step 1216, the wafer is etched to define rotors and stators (e.g., stator 332 and rotor 336 of actuator 304). The wafer is etched to define a limiter, step 1220, wherein the limiter is configured to limit a rotation of the shaft. For example, blocking element 704 with spring 708 of the blocking element 704 is formed. Step 1204 through step 1220, or a subset of steps 1204 through step 1220, can be performed concurrently (e.g., etching the device layer of an SOI wafer). In some embodiments, process 1200 further comprises depositing material on the mirror support to form a reflective surface (e.g., reflective surface 312). The process 1200 can further comprise depositing ohmic material on stator and rotor fingers and/or depositing electrical contacts to the stator and rotor. In some embodiments, a limiter is formed in a handle portion of the silicon substrate and/or the limiter is an extra comb as described in conjunction with FIG. 14.

Figure 13:
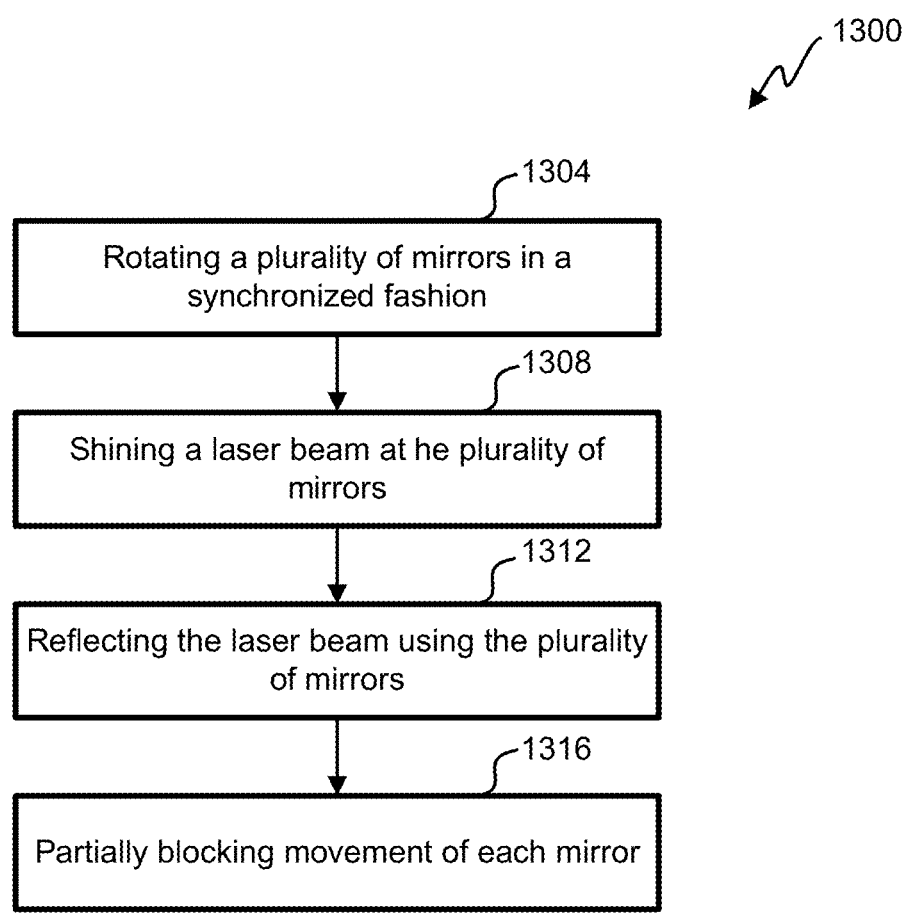
FIG. 13 illustrates a flowchart of an embodiment of a method of using a mirror array.

FIG. 13 illustrates a flowchart of an embodiment of a process 1300 of using a mirror array. Process 1300 beings in step 1304 with rotating a plurality of mirrors in a synchronized fashion. A light (e.g., a laser beam) is shined on the plurality of mirrors, step 1308. The plurality of mirrors reflect the light as a single, larger mirror because the plurality of mirrors are moving together (e.g., each mirror of the plurality of mirrors is tilted at the same angle in time).

Figure 14:
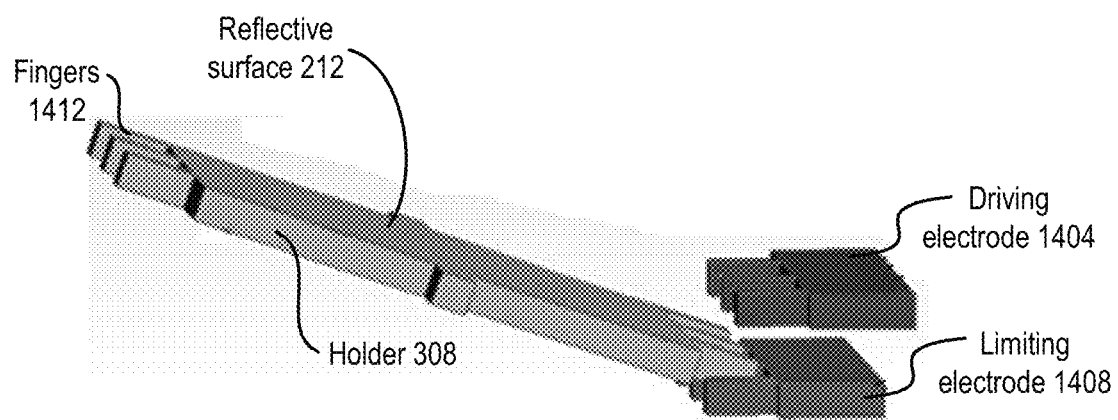
FIG. 14 depicts a simplified diagram of an embodiment using electrostatic force to limit rotation of a mirror.

In step 1316, movement of each mirror is partially blocked (e.g., by plate 504, blocking element 704, magnets 1104, and/or a limiting electrode as described in FIG. 14). By blocking movement of the mirrors, the mirrors rotate in a nonlinear fashion and are able to be driven by the same driving frequency.

FIG. 14 depicts a simplified diagram of an embodiment using electrostatic force (e.g., attraction) to limit rotation of a mirror. FIG. 14 shows the mirror substrate 308, the reflective surface 312, a driving electrode 1404, and a limiting electrode 1408 (sometimes referred to as a limiting comb). The limiting electrode 1408 can be referred to as a limiter. Fingers 1412 are formed in the mirror substrate 308. The driving electrode 1404 can repulse and/or attract the fingers 1412 using electrostatic repulsion or attraction. An AC signal is provided to the driving electrode 1404 to rotate the mirror substrate 308. A DC signal is provided to the limiting electrode. The limiting electrode 1408 is offset vertically from the driving electrode 1404. The limiting electrode repulses the fingers 1412 of the mirror substrate 308. As the mirror substrate 308 rotates and the fingers 1412 approach the limiting electrode 1408, the fingers 1412 of the mirror substrate 308 are attracted (or repulsed) by the limiting electrode 1408, which decelerates rotation of the mirror substrate 308. Interaction of the fingers 1412 with the limiting electrode 1408 makes rotation of the mirror substrate 308 nonlinear. Electrostatic force can be changed by changing dimensions of the limiting electrode 1408, changing dimensions of the fingers 1412, and/or changing an applied DC bias voltage.

Figure 15:
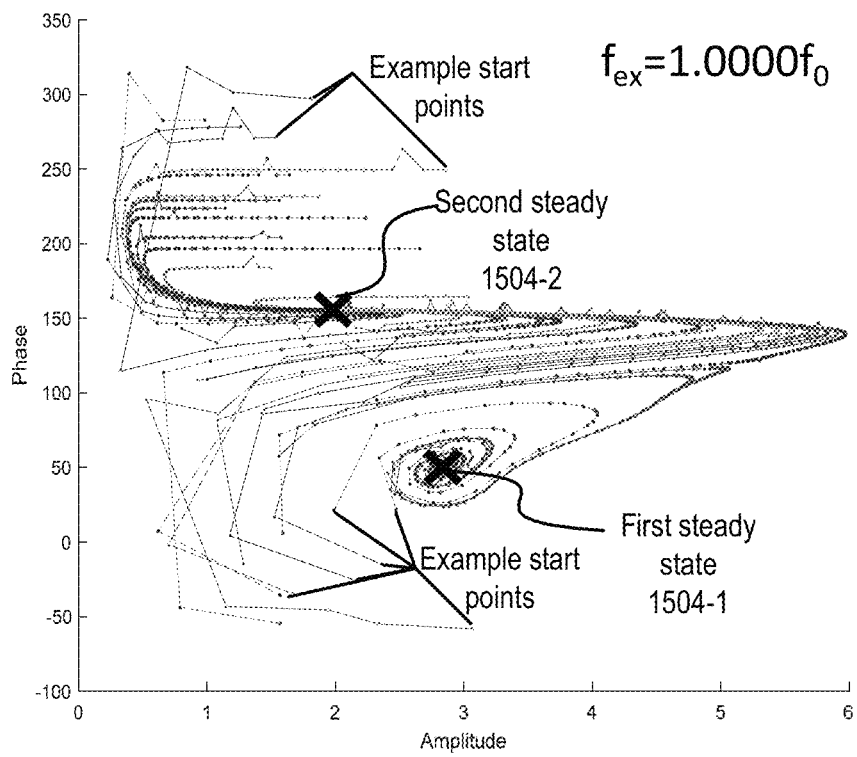
FIG. 15 is a graph of operation of a mirror converging to two steady state modes while the driving frequency is equal to a harmonic frequency of the mirror for various initial conditions.

FIG. 15 is a graph of operation of a mirror converging to two steady state modes while the driving frequency is equal to a harmonic frequency of the mirror, for various initial conditions. The excitation frequency $f_{ex}$ is equal to one. Initial conditions include initial phase difference and initial amplitude of the mirror. For different initial conditions (e.g., start points), Applicant notes that the mirror system converges to a first steady state 1504-1 or to a second steady state 1504-2 of operation. The first steady state 1504-1 is the mirror rotating about 50 degrees out of phase with the driving frequency. The second steady state 1504-2 is driving the mirror about 150 degrees out of phase with the driving frequency. The first steady state 1504-1 has a higher amplitude than the second steady state 1504-2. Accordingly, in some embodiments, the first steady state 1504-1 is preferable over the second steady state 1504-2, so that the mirror can scan a wider field of view. The steady state 1504 that a mirror will operate in is deterministic based on the initial conditions of the mirror.

Figure 16:
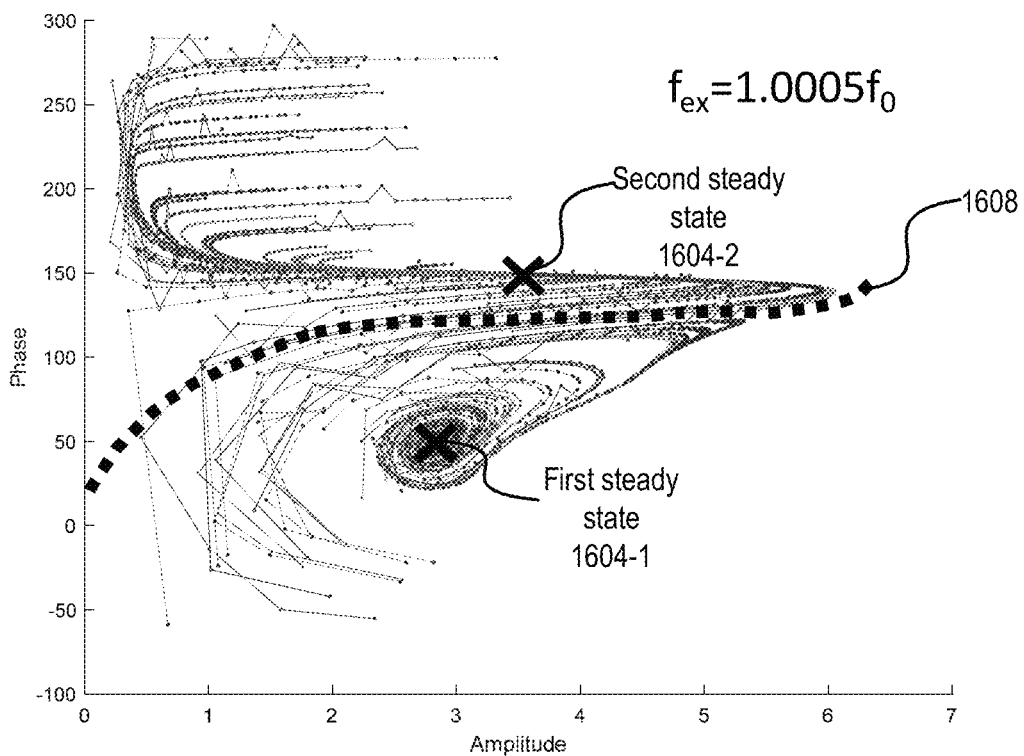
FIG. 16 is a graph of operation of a mirror converging to two steady state modes while the driving frequency is not equal to a harmonic frequency of the mirror for various initial conditions.

FIG. 16 is a graph of operation of a mirror converging to two steady state modes while the excitation frequency $f_{ex}$ is not equal to one, for various initial conditions. The driving frequency in FIG. 16 is slightly off the harmonic frequency of the mirror. For different initial conditions, Applicant notes that the mirror system converges to a first steady state 1604-1 or to a second steady state 1604-2 of operation. The first steady state 1604-1 is driving the mirror about 50 degrees out of phase with the driving frequency. The second steady state 1604-2 is driving the mirror about 150 degrees out of phase of the driving frequency. The amplitude of the first steady state 1604-1 in FIG. 16 is about equal to the amplitude of the first steady state 1504-1 in FIG. 15. The amplitude of the second steady state 1604-2 in FIG. 16 is much different than the amplitude of the second steady state 1504-2 in FIG. 15. Accordingly, in some embodiments having an array of mirrors, operating each mirror in the first steady state is preferable so that mirrors in the array have similar amplitudes.

A line 1608 divides initial parameters that will converge to the first steady state 1604-1 from initial parameters that will converge to the second steady state 1604-2. A system starting with a first set of initial parameters (e.g., phase and amplitude) below the line 1608 will converge to the first steady state 1604-1. An area below the line 1608 can define a set of phases that will converge to the first steady state 1604-1. The system starting with a second set of initial parameters (e.g., phase and amplitude) above the line 1608 will converge to the second steady state 1604-2.

Figure 17:
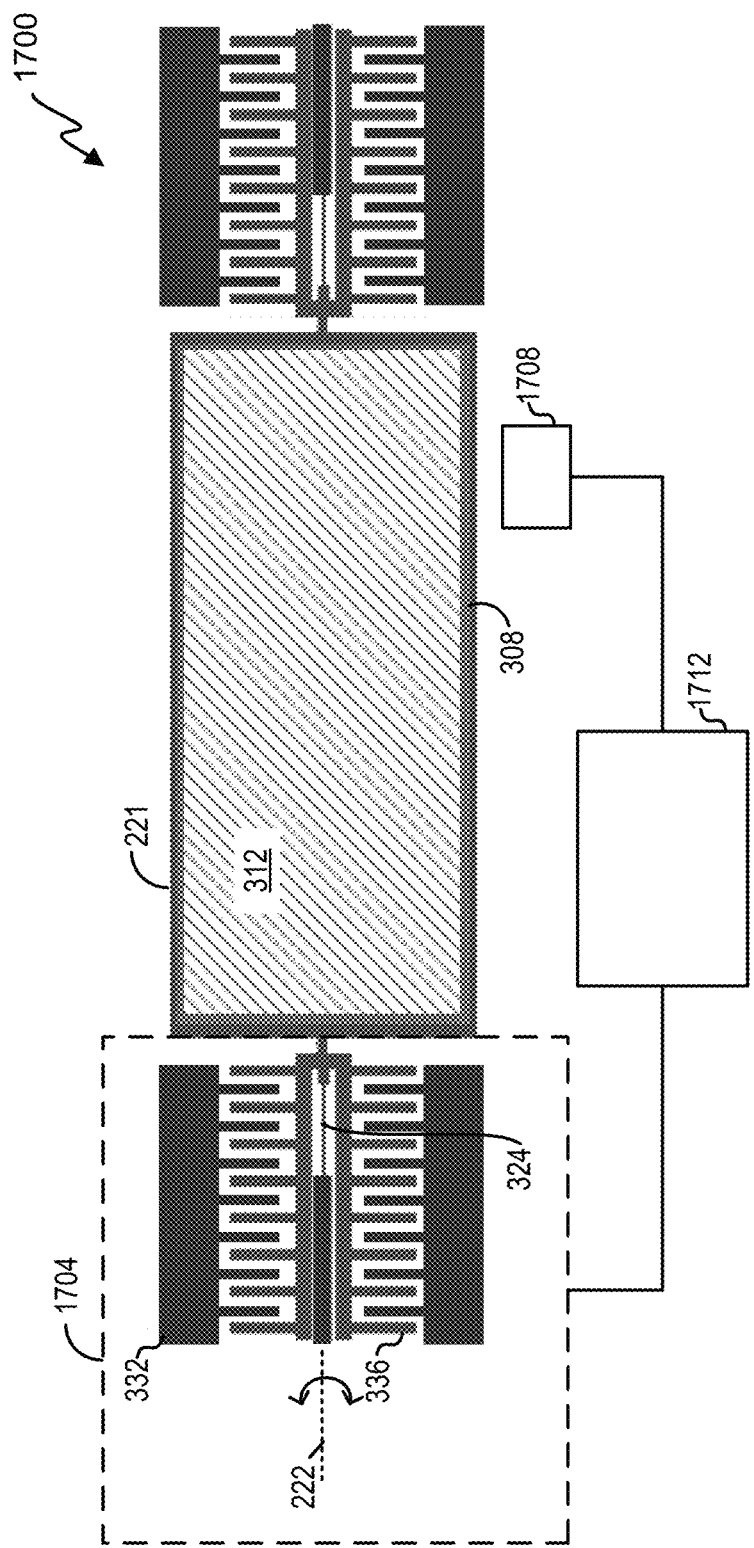
FIG. 17 is a partial diagram of an embodiment of a mirror system.

FIG. 17 is a partial diagram of an embodiment of a mirror system 1700. The mirror system 1700 comprises a mirror 221, which is a first mirror of an array of mirrors. The mirror 221 is mechanically coupled with a spring 324. A comb drive 1704 is configured to move the mirror 221, the spring 324, or both the mirror and the spring. The comb drive 1704 comprises a stator 332 and a rotor 336. The mirror system 1700 further comprises a sensor 1708. The sensor is configured to monitor rotation of the mirror 221 about the first axis 222. Examples of sensors include a rotation sensor (e.g., attached to a shaft), an inertial sensor (e.g., on the mirror 221 or rotor 336); a strain sensor (e.g., configured to detect strain in structures formed in the device layer of an SOI wafer as the mirror moves); an optical sensor (e.g., a diode for detecting reflections from the reflective surface 312, or reflections from the mirror substrate 308, as the mirror 221 rotates); electromagnetic (e.g., a ferromagnetic material is placed on mirror 221 and a Hall effect sensor is used to measure magnetic field); capacitive sensing (e.g., measuring capacitance change between a rotating mirror 221 and a stationary electrode); piezoelectric sensing (e.g., some piezoelectric material on the shaft 320; rotation causes stress in the shaft, which creates a measureable voltage signal); piezoresistive (e.g., measuring stress change in a material's resistance; material can be silicon so resistance of the shaft 320 can be directly measured); and an electrical sensor (e.g., a reed switch that closes a circuit as a magnet passes by).

The mirror system 1700 further comprises electronics 1712. The electronics are configured to provide a drive signal to the comb drive 1704. The drive signal determines how the rotor 336 is electromagnetically attracted and/or repulsed by the stator 332. The electronics are also configured to receive data from the sensor 1708. The electronics 1712 can use the data from the sensor 1708 to determine whether the first mirror is out of sync with the second mirror. For example, the first mirror could be operating in the second steady state and the first mirror could be operating in the first steady state. The electronics 1712 can determine the first mirror is operating in the second steady state in various ways. For example, the electronics could compare the data from the first sensor to data from the second sensor to determine the first mirror is out of sync with movement of the second mirror based on the first data being different from the second data; and/or the data from the sensor 1708 could be compared to a voltage of the drive signal (e.g., comparing the data to the voltage across time). In some embodiments, it doesn't really matter if the first mirror is operating in the first steady state and the second mirror is operating in the second steady state, or vice versa, to detect an error; all mirrors could be reset to initial conditions based on an indication that at least one mirror, or a threshold number of mirrors (e.g., 5, 10, or 25% of mirrors in the array) are not operating in the same steady state.

The electronics 1712 are configured to alter the drive signal so that a phase difference between the rotation of the mirror 221 and the drive signal changes, so that the mirror 221 operates at a phase and/or amplitude that converges to the first steady state of operation (e.g., drawing a line vertically from above the line 1608 to below the line 1608 in FIG. 16; or sweeping a frequency change from high to low or low to high until the mirror converges to the first steady state). The electronics 1712 can use continued data from the sensor 1708 to verify that operation of the mirror 221 is at the first steady state (e.g., that the first mirror is operating in sync with the second mirror). The electronics 1712 can be centralized for the array of mirrors (e.g., one processor) or distributed (e.g., many processors, such as one processor per mirror).

In some embodiments, the mirror system 1700 comprises a limiter, separate from the comb drive (e.g., blocking element 704). In some embodiments, the comb drive 1704 is driven nonlinearly by the drive signal. As the mirror system 1700 is driven nonlinearly, either by the drive signal or by the use of a physical limiter, the mirror system 1700 can have two steady state modes of operation.

Figure 18:
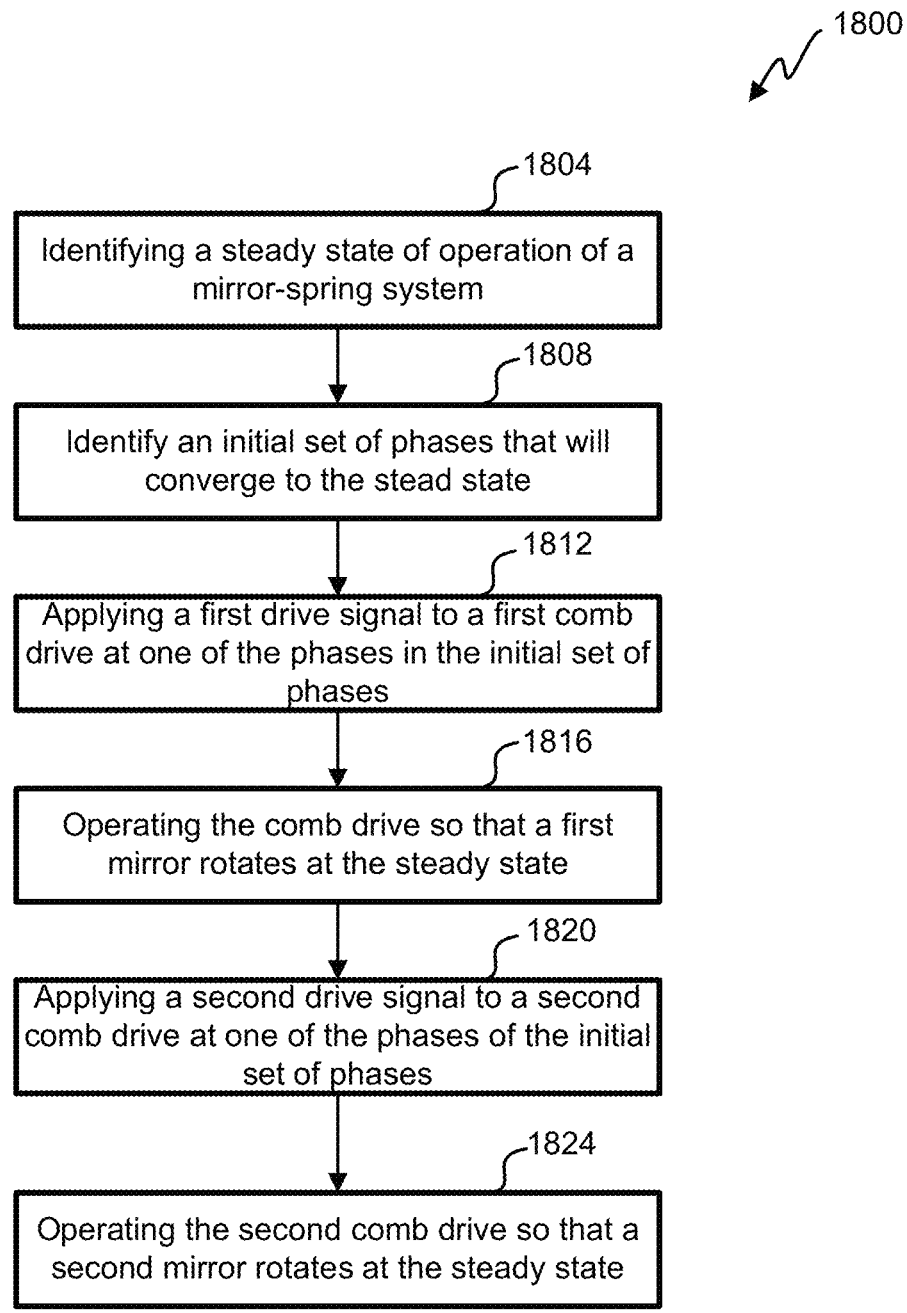
FIG. 18 illustrates a flowchart of an embodiment of a process 1800 of using a non-linear system to synchronize motion of a plurality of mirrors.

FIG. 18 illustrates a flowchart of an embodiment of a process 1800 of using a non-linear system to synchronize motion of a plurality of mirrors. Process 1800 begins in step 1804 with identifying a steady state of operation of a mirror-spring system (e.g., identifying the first steady state 1504-1 or 1604-1 of the mirror system 1700). In step 1808, an initial phase, or an initial set of phases, are identified (e.g., determining the line 1608 in FIG. 16 and initial phases and/or corresponding amplitudes below the line 1608 that will converge to the first steady state 1604-1), wherein starting the system with the initial phase, or phases of the set of initial phases, will cause the system to operate at the steady state identified in step 1804.

In step 1812, a first drive signal is applied to a first comb drive, wherein the first drive signal starts to rotate the first comb drive at the initial phase, or one of the phases from the set of initial phases, identified in step 1808. In step 1816, the first comb drive is operated so that the first mirror converges to rotate at the steady state identified in step 1804. In step 1820, a second drive signal is used to activate a second comb drive, wherein the second drive signal starts to rotate the second comb drive at the initial phase, or one of the phases from the set of initial phases, identified in step 1808. In step 1824, the second comb drive is operated so that the second mirror converges to rotate at the steady state identified in step 1804. Since the first mirror and the second mirror have rotations that converge to the same steady state of operation, the first mirror and second mirror rotate in sync. In some embodiments, the first drive signal is similar to the second drive signal (e.g., the same and/or the same plus or minus 1, 2, 5, or 10%) during steady state operation.

In certain embodiments, a method of using a non-linear system to synchronize motion of a plurality of mirrors comprises using a first combdrive actuator to move a first mirror at an amplitude and a frequency; using a second combdrive actuator to move a second mirror at the amplitude and at the frequency of the first mirror so that the first mirror and the second mirror move in a synchronized motion, wherein the motion is non-linear having a first steady state of operation and a second steady state of operation; and/or configuring the first mirror and the second mirror to have starting parameters so that the first mirror and the second mirror will both operate at the first steady state of operation.

If mirrors in an array get out of sync with each other (e.g., a jolt to the system), the actuators can be turned off, which allows the mirrors to return to their initial parameters. Then the system can be restarted. The method in the preceding paragraph may further comprise: determining that the first mirror and the second mirror are out of sync; turning off the first combdrive actuator and the second combdrive actuator; allowing the first mirror and the second mirror to return to starting parameters; and/or turning on the first combdrive actuator and the second combdrive actuator so that the first mirror and the second mirror move in the synchronized motion.

Figure 19:
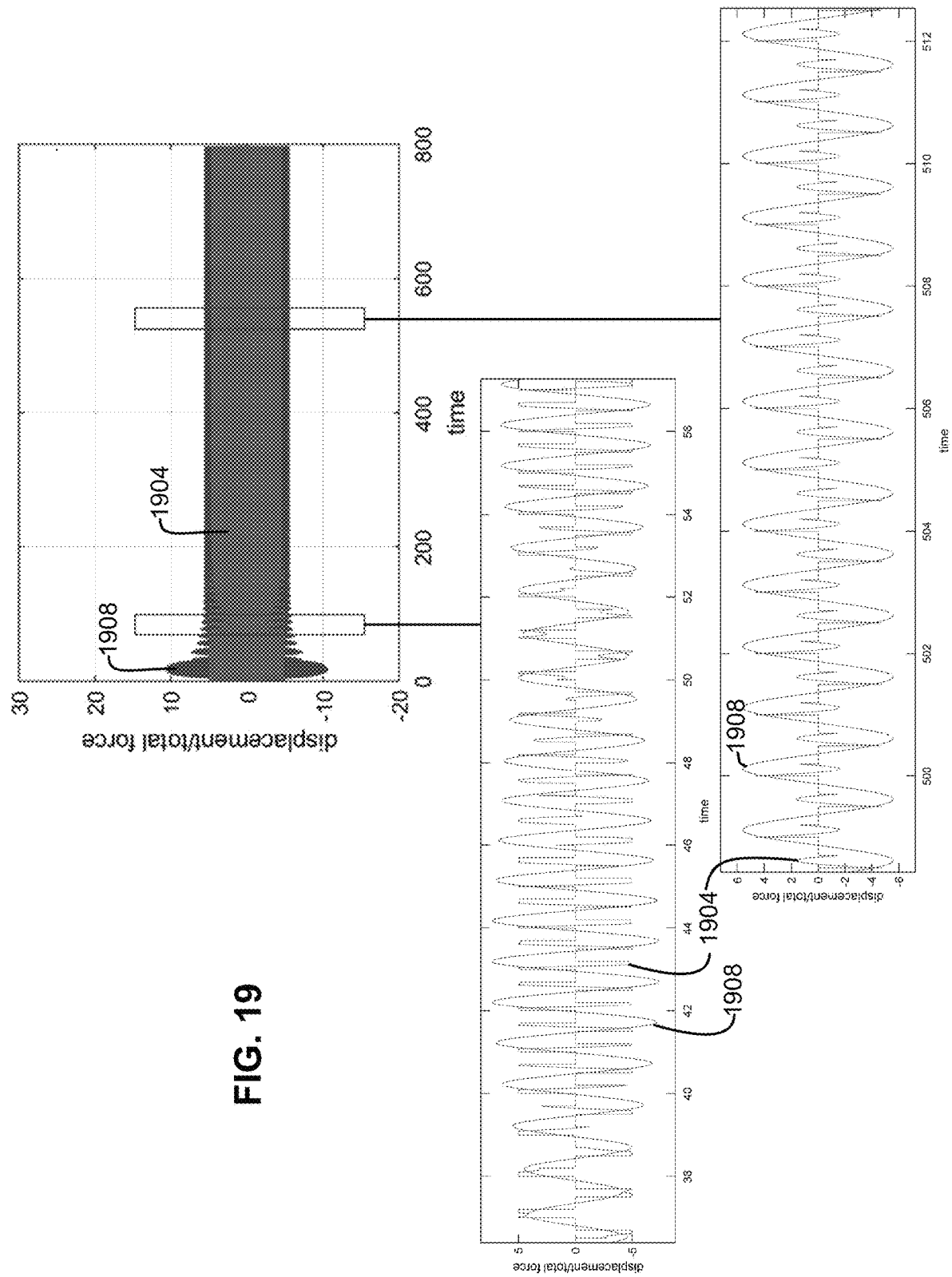
FIG. 19 depicts an embodiment of a mirror system converging to a steady state of operation.

FIG. 19 depicts an embodiment of a mirror system converging to a steady state of operation. The horizontal axis is time measured in milliseconds. FIG. 19 shows a drive signal 1904 in relation to mirror position 1908. The vertical axis is arbitrary voltage for the drive signal 1904 and arbitrary position (displacement) for mirror position 1908.

From FIG. 19, it can be seen that the mirror position first rotates at larger and varied amplitudes (e.g., time=38 to 56 milliseconds) before settling down to steady state operation (e.g., time=500 milliseconds to 512 milliseconds, and beyond).

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc.

A recitation of "a", "an", or "the" is intended to mean "one or more" unless specifically indicated to the contrary.

All patents, patent applications, publications, and descriptions mentioned here are incorporated by reference in their entirety for all purposes. None is admitted to be prior art.

What is claimed is:

1. A device for beam steering in a Light Detection and Ranging (LiDAR) system of an autonomous vehicle, the device comprising:
   a mirror;
   a spring mechanically coupled with the mirror;
   a combdrive actuator configured to move the mirror, the spring, or both the mirror and the spring; and
   a limiter configured to limit an angular rotational range of motion of the mirror, wherein:
      the mirror is part of the plurality of mirrors; and
      the plurality of mirrors are synchronized to move together in time based on the limiter limiting the angular rotational range of motion of the mirror, so that angular rotation of the plurality of mirrors in time are the same.

2. The device of claim 1, wherein the mirror is formed as part of a microelectromechanical system, and a reflective surface of the mirror has a width equal to or less than 15 millimeters.

3. The device of claim 1, wherein the limiter comprises a hard stop configured to contact the mirror to prevent the mirror from continued rotation about an axis.

4. The device of claim 3, wherein the hard stop is glass.

5. The device of claim 1, wherein the mirror comprises a support and a reflective surface.

6. The device of claim 1, wherein the mirror is rectangular.

7. The device of claim 1, wherein the mirror is mechanically coupled with the spring by a shaft.

8. The device of claim 7, wherein the shaft has a rectangular cross section.

9. The device of claim 7, wherein the limiter comprises a contact to limit an angular rotational range of motion of the shaft to limit the angular rotational range of motion of the mirror.

10. The device of claim 9, wherein the limiter comprises a spring.

11. The device of claim 10, wherein the spring of the limiter is configured to have a stiffness based on a mass of the mirror.

12. The device of claim 1, wherein the combdrive actuator comprises a plurality of stator fingers and a plurality of rotor fingers.

13. The device of claim 1, wherein:
the limiter comprises a first set of magnets and a second set of magnets;
the first set of magnets are positioned on a substrate;
the second set of magnets are positioned on the mirror; and
the first set of magnets are oriented to repulse the second set of magnets.

14. The device of claim 1, wherein the device is configured as a scanning mirror in a LiDAR system.

15. The device of claim 1, wherein the device is a microelectromechanical system (MEMS) device.

16. The device of claim 1, further comprising a plurality of drivers configured to move the plurality of mirrors, wherein the plurality of drivers are configured to drive mirrors of the plurality of mirrors at the same frequency.

17. A method of using a mirror array, the method comprising: rotating a plurality of mirrors, wherein: rotating comprises using a plurality of drivers operating at the same frequency; and rotating the plurality of mirrors is performed so that motion of the plurality of mirrors are synchronized; shining a laser beam at the plurality of mirrors; reflecting the laser beam using the plurality of mirrors, so that the mirrors act as a single mirror to reflect the laser beam; and partially blocking rotational movement of each mirror of the plurality of mirrors using a limiter at each mirror so that rotational movement of each mirror is nonlinear, wherein the nonlinear movement facilitates synchronization of movement of the plurality of mirrors while driving the plurality of mirrors at the same frequency.

18. The method of claim 17, wherein blocking rotational movement of each mirror of the plurality of mirrors blocks rotation of a shaft used to move a mirror of the plurality of mirrors and/or blocks rotation by physical contact with the mirror.

19. The method of claim 17, wherein blocking movement of each mirror of the plurality of mirrors is performed using magnetic repulsion.

20. A method of manufacturing a device for use in a Light Detection and Ranging (LiDAR) system, the method comprising:
etching to define a mirror support;
etching to define a spring;
etching a shaft that mechanically couples the mirror support with the spring;
etching rotors and stators of a driver, wherein the driver is configured to move the shaft;
etching a limiter configured to limit a rotation range of the shaft and limit an angular rotation range of the mirror support to facilitate synchronization motion of the mirror support with a plurality of mirrors, so that angular rotation of the plurality of mirrors in time are the same; and
coating at least a portion of the mirror support to create a reflective surface on the mirror support.

* * * * *